(12) United States Patent
Leem et al.

(10) Patent No.: US 9,543,361 B2
(45) Date of Patent: Jan. 10, 2017

(54) ORGANIC PHOTOELECTRONIC DEVICE INCLUDING A PN JUNCTION AND IMAGE SENSOR

(71) Applicant: Samsung Electronics Co., Ltd., Suwon-si, Gyeonggi-do (KR)

(72) Inventors: Dong-Seok Leem, Hwaseong-si (KR); Kwang Hee Lee, Yongin-si (KR); Sung Young Yun, Suwon-si (KR); Gae Hwang Lee, Seongnam-si (KR); Xavier Bulliard, Seongnam-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/646,000

(22) Filed: Mar. 12, 2015

(65) Prior Publication Data

US 2016/0064455 A1 Mar. 3, 2016

(30) Foreign Application Priority Data

Aug. 26, 2014 (KR) ........................ 10-2014-0111824

(51) Int. Cl.
| | |
|---|---|
| *H01L 29/08* | (2006.01) |
| *H01L 27/30* | (2006.01) |
| *H01L 51/00* | (2006.01) |
| *H01L 51/42* | (2006.01) |

(52) U.S. Cl.
CPC ......... *H01L 27/307* (2013.01); *H01L 51/0073* (2013.01); *H01L 51/008* (2013.01); *H01L 51/4253* (2013.01); *H01L 2251/308* (2013.01); *Y02E 10/549* (2013.01)

(58) Field of Classification Search
CPC ........... H01L 27/30; H01L 51/44; H01L 51/00
USPC ............................................. 257/40
See application file for complete search history.

(56) References Cited

U.S. PATENT DOCUMENTS

| | | | | |
|---|---|---|---|---|
| 4,107,724 A | * | 8/1978 | Ralph | ............... H01L 31/02322 136/250 |
| 4,308,334 A | * | 12/1981 | Kinoshita | ................ G03G 5/09 430/130 |
| 4,837,435 A | * | 6/1989 | Sakuhara | ............... B82Y 35/00 250/307 |
| 6,330,262 B1 | | 12/2001 | Burrows et al. | |
| 8,564,188 B2 | | 10/2013 | Tabata et al. | |

(Continued)

FOREIGN PATENT DOCUMENTS

| | | |
|---|---|---|
| JP | 3309131 B2 | 7/2002 |
| WO | WO-2010023603 A2 | 3/2010 |

OTHER PUBLICATIONS

S. Aihara, et al., "Wavelength selectivitiesselectivities of organic photoconductive films: Dye-doped polysilanes and zinc phthalocyanine/tris-8-hydroxyquinoline aluminum double layer", Applied Physics Letters vol. 82, No. 4, Jan. 27, 2003, pp. 511-513.

*Primary Examiner* — Caleb Henry
(74) *Attorney, Agent, or Firm* — Harness, Dickey, & Pierce, P.L.C.

(57) ABSTRACT

An organic photoelectronic device includes a first electrode and a second electrode facing each other, and an active layer between the first electrode and the second electrode, the active layer including a heterojunction of a p-type semiconductor and an n-type semiconductor, the p-type semiconductor including a compound represented by Chemical Formula 1.

19 Claims, 11 Drawing Sheets

(56) References Cited

U.S. PATENT DOCUMENTS

| | | | |
|---|---|---|---|
| 2005/0040390 A1* | 2/2005 | Pfeiffer | H01L 51/002 257/40 |
| 2007/0290195 A1 | 12/2007 | Forrest | |
| 2008/0030129 A1* | 2/2008 | Aratani | H01L 27/3211 313/504 |
| 2010/0282309 A1* | 11/2010 | Pschirer | B82Y 10/00 136/255 |
| 2011/0155249 A1* | 6/2011 | Tanabe | C09B 23/0058 136/263 |
| 2011/0253218 A1* | 10/2011 | Tanabe | C09B 23/0008 136/263 |

* cited by examiner

ORGANIC PHOTOELECTRONIC DEVICE INCLUDING A PN JUNCTION AND IMAGE SENSOR

CROSS-REFERENCE TO RELATED APPLICATION

This application claims priority to and the benefit of Korean Patent Application No. 10-2014-0111824 filed in the Korean Intellectual Property Office on Aug. 26, 2014 the entire contents of which are incorporated herein by reference.

BACKGROUND

1. Field

Example embodiments relate to an organic photoelectronic device and an image sensor including the same.

2. Description of the Related Art

A photoelectronic device converts light into an electrical signal using photoelectronic effects, and may include a photodiode and/or a phototransistor. The photoelectronic device may be applied to an image sensor, a solar cell and/or an organic light emitting diode.

An image sensor including a photodiode requires relatively high resolution and thus a relatively small pixel. At present, a silicon photodiode is widely used, but the silicon photodiode has a problem of deteriorated sensitivity and has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectronic device being capable of heightening wavelength selectivity due to improved light absorption characteristics in a thin film state and decreasing a crosstalk between each pixel.

Example embodiments also provide an image sensor including the organic photoelectronic device.

According to example embodiments, an organic photoelectronic device includes a first electrode and a second electrode facing each other, and an active layer between the first electrode and the second electrode, the active layer including a heterojunction of a p-type semiconductor and an n-type semiconductor, the p-type semiconductor including a compound represented by the following Chemical Formula 1.

[Chemical Formula 1]

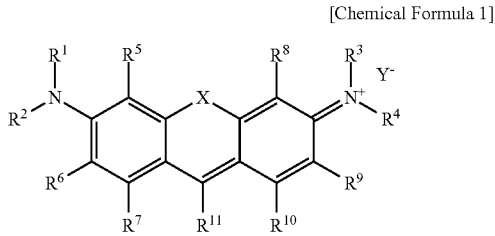

In the Chemical Formula 1,

X is one of oxygen (—O—) and sulfur (—S—), each of $R^1$ to $R^{11}$ are independently one of hydrogen, a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_3$ to $C_{30}$ heteroaryl group, and a combination thereof, and $Y^-$ is a halogen ion.

Each of the $R^1$ to $R^4$ may be independently one of hydrogen, a substituted or unsubstituted $C_1$ to $C_{30}$ alkyl group, and a combination thereof.

The $R^{11}$ may be a group derived from one of a substituted or unsubstituted benzene, naphthalene, anthracene, biphenyl, and a combination thereof.

The $R^{11}$ may be a —COOR' group substituting at least one hydrogen. The R' is one of hydrogen, a substituted or unsubstituted $C_1$ to $C_{30}$ alkyl group, and a combination thereof.

At least one of the $R^5$ to $R^{11}$ may be one of a substituted or unsubstituted $C_1$ to $C_{30}$ alkoxy group and a substituted or unsubstituted $C_1$ to $C_{30}$ alkyl group.

The X may be oxygen (—O—), and the $Y^-$ is a chloride ion (—Cl$^-$).

The compound represented by the Chemical Formula 1 may have a maximum absorption wavelength of 500 to 600 nm in a visible ray region.

The p-type semiconductor may include a compound represented by the following Chemical Formula 1a, Chemical Formula 1b, or Chemical Formula 1c.

[Chemical Formula 1a]

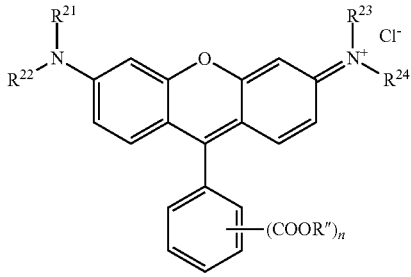

[Chemical Formula 1b]

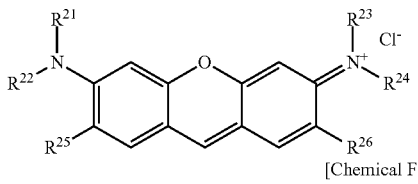

[Chemical Formula 1c]

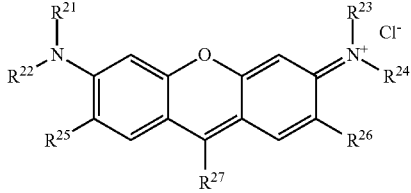

In the Chemical Formulae 1a to 1c, each of $R^{21}$ to $R^{24}$ are independently one of hydrogen, a substituted or unsubstituted $C_1$ to $C_{30}$ alkyl group, and a combination thereof, each of $R^{25}$ to $R^{27}$ are independently one of an unsubstituted $C_1$ to $C_{30}$ alkyl group, a substituted or unsubstituted $C_1$ to $C_{30}$ alkoxy group, and a combination thereof, R" is one of hydrogen, a substituted or unsubstituted $C_1$ to $C_{30}$ alkyl group, and a combination thereof, and n is 0 or 1.

The n-type semiconductor may be one of a compound represented by the following Chemical Formula 2, NTCDA (1,4,5,8-naphthalenetetracarboxylic dianhydride), fullerene ($C_{60}$), dicyanovinyl-terthiophene (DCV3T), and a combination thereof.

[Chemical Formula 2]

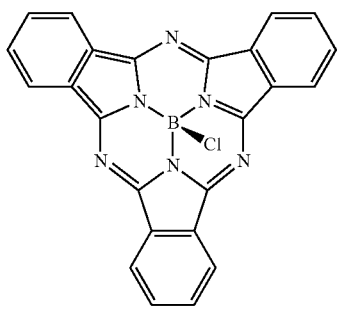

In the Chemical Formula 2, each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

The compound represented by the Chemical Formula 2 may be one of compounds represented by the following Chemical Formulae 2a to 2e.

[Chemical Formula 2a]

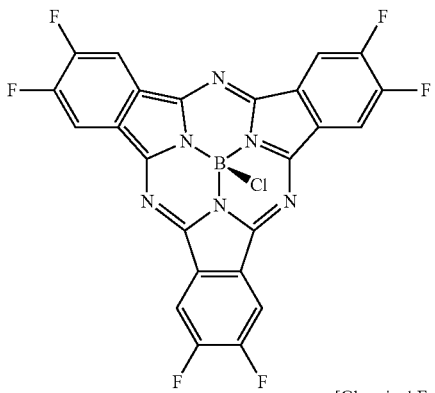

[Chemical Formula 2b]

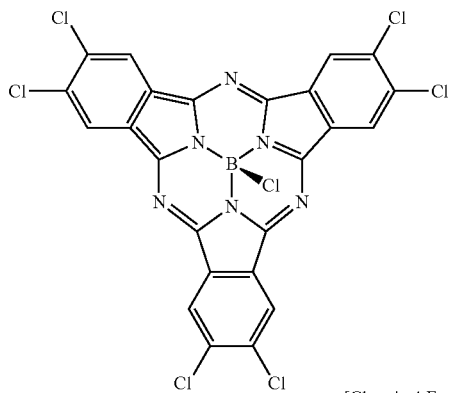

[Chemical Formula 2c]

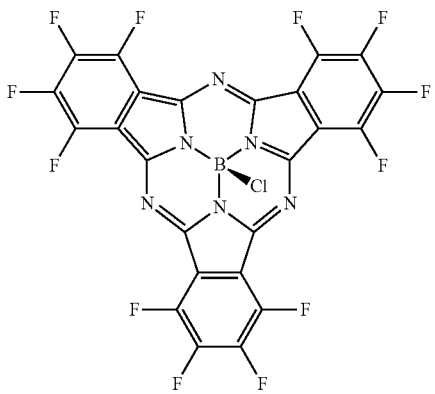

[Chemical Formula 2d]

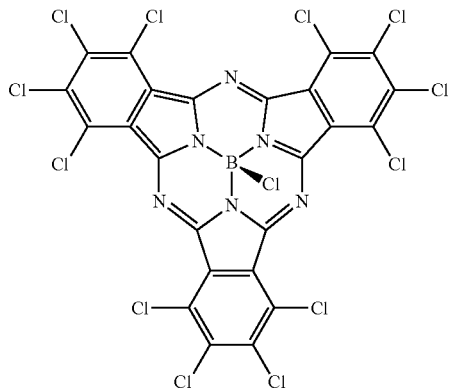

[Chemical Formula 2e]

The organic photoelectronic device may show a light absorption curve having a full width at half maximum (FWHM) of about 50 nm to about 150 nm.

The active layer may selectively absorb light in a green wavelength region.

The active layer may include an intrinsic layer including the p-type semiconductor and the n-type semiconductor in a ratio of about 1:100 to about 100:1.

The active layer may include an intrinsic layer including the p-type semiconductor and the n-type semiconductor in a ratio of about 1:10 to about 10:1.

The active layer may further include a p-type layer including the p-type semiconductor.

The active layer may further include a n-type layer including the n-type semiconductor.

The organic photoelectronic device may further include a charge auxiliary layer between at least one of the first electrode and the active layer, and the second electrode and the active layer.

According to example embodiments, an image sensor includes the organic photoelectronic device.

The image sensor may include a semiconductor substrate integrated with a plurality of first photo-sensing devices sensing light in a blue wavelength region and a plurality of second photo-sensing devices sensing light in a red wavelength region, a color filter layer on the semiconductor substrate and including a blue filter selectively absorbing light in a blue wavelength region and a red filter selectively absorbing light in a red wavelength region, wherein the organic photoelectronic device may be on the color filter layer and selectively absorb light in a green wavelength region.

The organic photoelectronic device may be a green photoelectronic device, and the image sensor may further include a blue photoelectronic device selectively absorbing light in a blue wavelength region, and a red photoelectronic device selectively absorbing light in a red wavelength region, wherein the organic photoelectronic device, a blue photoelectronic device and a red photoelectronic device are sequentially stacked.

DETAILED DESCRIPTION

Figure 1:
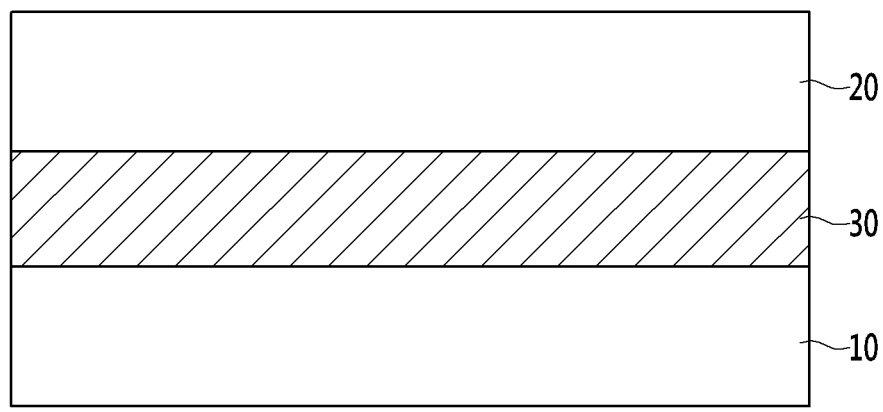
FIG. 1 is a cross-sectional view showing an organic photoelectronic device according to example embodiments.

Example embodiments will hereinafter be described in detail, and may be more easily performed by those who have common knowledge in the related art. However, this disclosure may be embodied in many different forms and is not construed as limited to the example embodiments set forth herein.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "substituted" refers to one substituted with at least a functional group selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic photoelectronic device according to example embodiments is described referring to FIG. 1.

FIG. 1 is a cross-sectional view showing an organic photoelectronic device according to example embodiments.

Referring to FIG. 1, an organic photoelectronic device 100 according to example embodiments includes a first electrode 10 and a second electrode 20 facing each other, and an active layer 30 between the first electrode 10 and the second electrode 20. FIG. 1 shows the first electrode 10 positioned beneath the active layer 30, while the second electrode 20 is positioned on the active layer 30. However, the second electrode 20 may be positioned beneath the active layer 30, and the first electrode 10 may be positioned on the active layer 30.

At least one of the first electrode 10 and second electrode 20 may be a light transmission electrode, and the light transmission electrode may be made of, for example, a transparent conductor (e.g., indium tin oxide (ITO) and/or indium zinc oxide (IZO)), a metal thin film having a thickness of several nanometers to tens of nanometers, or a metal thin film doped with a metal oxide having a thickness of several nanometers to tens of nanometers. The other of the first electrode 10 and second electrode 20 may be made of, for example, an opaque conductor, e.g., aluminum (Al).

The active layer 30 includes a mixed p-type semiconductor material and n-type semiconductor material to form a pn junction, and externally receives light, produces excitons, and separates the excitons into holes and electrons.

The p-type semiconductor material includes a compound represented by the following Chemical Formula 1.

[Chemical Formula 1]

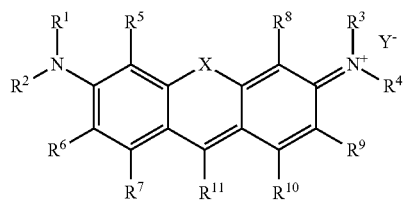

In the Chemical Formula 1,

X is one of oxygen (—O—) and sulfur (—S—), and each of $R^1$ to $R^{11}$ are independently one of hydrogen, a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and $Y^-$ is a halogen ion, for example, F, $Br^-$, $Cl^-$, or $I^-$.

For example, each of the $R^1$ to $R^4$ are independently one of hydrogen, a substituted or unsubstituted $C_1$ to $C_{30}$ alkyl group, and a combination thereof. For example, one of the $R^1$ and $R^2$ may be a methyl group and the other is hydrogen, and one of the $R^3$ and $R^4$ may be a methyl group and the other is hydrogen. For example, the $R^1$ to $R^4$ may all be methyl groups. However, these are examples and they are not limited thereto.

For example, at least one of the $R^5$ to $R^{11}$ may be one of a substituted or unsubstituted $C_1$ to $C_{30}$ alkoxy group and a substituted or unsubstituted $C_1$ to $C_{30}$ alkyl group. For example, the $R^6$ and $R^9$ may be a methoxy group, or the $R^{11}$ may be a methoxy group. However, these are examples and they are not limited thereto.

For example, the $R^{11}$ may include a group derived from a substituted or unsubstituted benzene, naphthalene, anthracene, biphenyl, or a combination thereof, and for example, the $R^{11}$ may be a —COOR' group substituting at least one hydrogen. Herein, the R' refers to hydrogen, a substituted or unsubstituted $C_1$ to $C_{30}$ alkyl group, or a combination thereof. For example, the $R^{11}$ may be a phenyl group substituted with —COOH or —COOC$_2$H$_5$, but is not limited thereto.

For example, the X may be oxygen (—O—), and the $Y^-$ may be a chloride ion (—Cl$^-$).

The compound represented by the Chemical Formula 1 may have a maximum absorption wavelength in a 500 to 600 nm wavelength region in a visible ray region. The compound is included in the active layer 30 along with an n-type semiconductor compound, and is capable of selectivity heightening wavelength due to improved light absorption characteristics and decreasing crosstalk between each pixel due to improved full width at half maximum (FWHM) characteristics.

The compound represented by the Chemical Formula 1 may be, for example, represented by the following the following Chemical Formula 1a, Chemical Formula 1b, or Chemical Formula 1c, but is not limited thereto.

[Chemical Formula 1a]

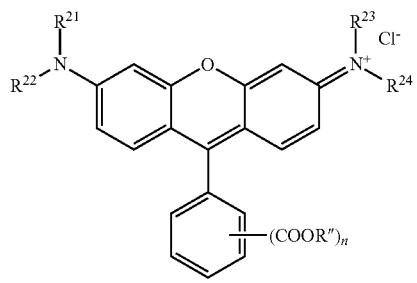

-continued

[Chemical Formula 1b]

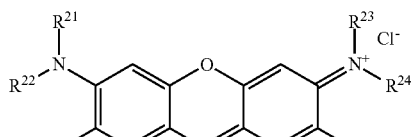

[Chemical Formula 1c]

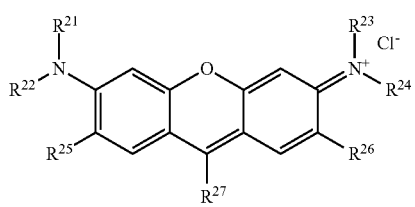

In the Chemical Formulae 1a to 1c, each of $R^{21}$ to $R^{24}$ are independently one of hydrogen, a substituted or unsubstituted $C_1$ to $C_{30}$ alkyl group, and a combination thereof, each of $R^{25}$ to $R^{27}$ are independently one of an unsubstituted $C_1$ to $C_{30}$ alkyl group, a substituted or unsubstituted $C_1$ to $C_{30}$ alkoxy group, and a combination thereof, R" is one of hydrogen, a substituted or unsubstituted $C_1$ to $C_{30}$ alkyl group, and a combination thereof, and n is 0 or 1.

Hereinafter, the n-type semiconductor is described.

The n-type semiconductor may be any material forming a heterojunction with the p-type semiconductor without limitation, and may be, for example, one of a compound represented by the following Chemical Formula 2, a boron-sub-phthalocyanine derivative, NTCDA (1,4,5,8-naphthalene tetracarboxylic dianhydride), a fullerene (C60), dicyanovinyl-terthiophene (DCV3T), and a combination thereof.

[Chemical Formula 2]

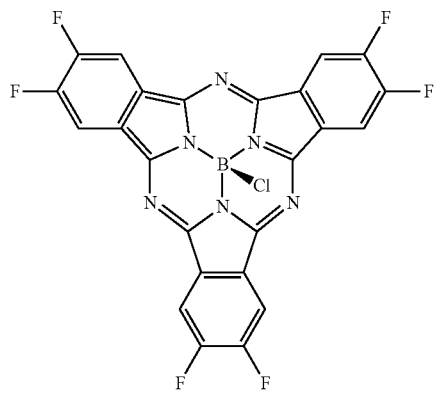

In the Chemical Formula 1, each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

Specifically, the compound represented by the Chemical Formula 2 may be represented by one of the following Chemical Formulae 2a to 2e.

[Chemical Formula 2a]

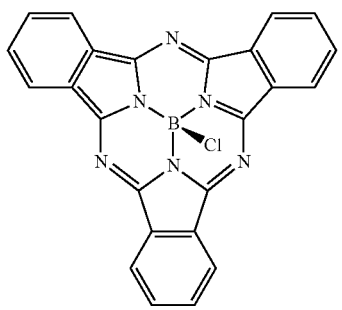

[Chemical Formula 2b]

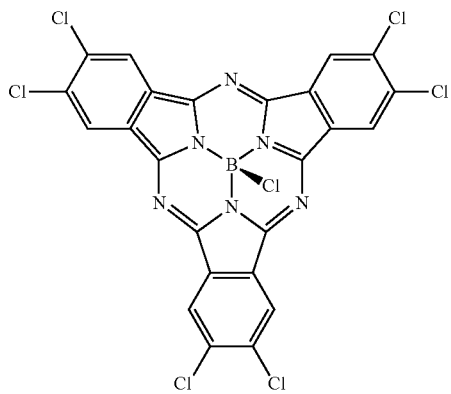

[Chemical Formula 2c]

[Chemical Formula 2d]

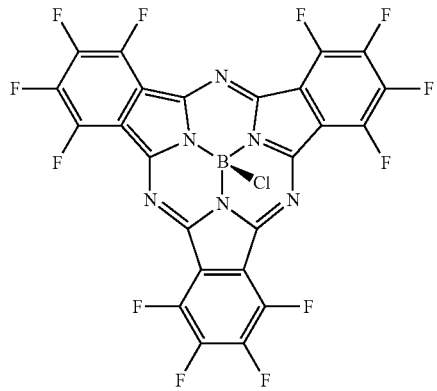

[Chemical Formula 2e]

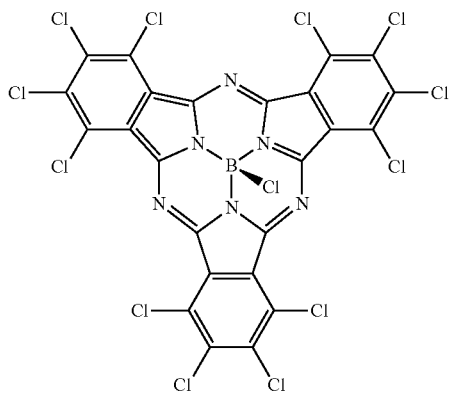

For example, the active layer 30 may show a light absorption curve having a full width at half maximum (FWHM) of about 50 nm to about 150 nm, for example about 50 nm to about 140 nm, about 50 nm to about 130 nm, or about 50 nm to about 120 nm. Herein, the FWHM is a width of a wavelength corresponding to a half of a maximum absorption point. As used herein, when specific definition is not otherwise provided, it may be defined by absorbance measured by UV-Vis spectroscopy. A smaller FWHM indicates selective absorption of light in a relatively narrow wavelength region and relatively high wavelength selectivity. Within the FWHM range, selectivity for a green wavelength region may be increased.

The active layer 30 may selectively absorb light in a green wavelength region.

The active layer 30 may be a single layer or a multilayer. The active layer 30 may be, for example, an intrinsic layer (I layer), a p-type layer/n-type layer, a p-type layer/I layer, an I layer/n-type layer, and a p-type layer/I layer/n-type layer.

The intrinsic layer (I layer) may include the p-type semiconductor compound and the n-type semiconductor compound in a ratio of about 1:100 to about 100:1. The compounds may be included in a ratio ranging from about 1:50 to about 50:1 within the range, for example, about 1:10 to about 10:1, or for example, about 1:1, or about 2:1 or about 1:2. When the p-type and n-type semiconductors have a composition ratio within the range, an exciton may be effectively produced and a pn junction may be effectively formed.

The p-type layer may include the compound represented by the Chemical Formula 1, and the n-type layer may include the compound represented by the Chemical Formula 3.

The active layer 30 may have a thickness of about 1 nm to about 500 nm, for example, about 5 nm to about 300 nm. Within the thickness range, the active layer may effectively absorb light, effectively separate holes from electrons, and deliver them, thereby effectively improving photoelectronic conversion efficiency.

In the organic photoelectronic device 100, when light enters from the first electrode 10 and/or second electrode 20, and when the active layer 30 absorbs light having a predetermined or given wavelength region, excitons may be produced from the inside. The excitons are separated into holes and electrons in the active layer 30, and the separated holes are transported to the first electrode 10, while the separated electrons are transported to the second electrode 20 so as to flow a current in the organic photoelectronic device.

The organic photoelectronic device 100 may further include a light-transmitting auxiliary layer (not shown) at the side where light enters. For example, when the first electrode 10 is a light-transmitting electrode, the light-transmitting auxiliary layer may be positioned on one side of the first electrode 10, but when the second electrode 20 is a light-transmitting electrode, the light-transmitting auxiliary layer may be positioned on one side of the second electrode 20. The light-transmitting auxiliary layer is disposed at the side where light enters and may lower reflectance of the light and increase light absorption.

The light-transmitting auxiliary layer may include a material having a refractive index of about 1.6 to about 2.5, and may include at least one of a metal oxide, a metal sulfide, and an organic material having a refractive index within the range. The metal oxide may include, for example, tungsten oxide, zinc oxide, indium oxide, tin oxide, indium tin oxide (ITO), indium zinc oxide (IZO), aluminum oxide, aluminum tin oxide (ATO), fluorine-doped tin oxide (FTO), molybdenum oxide, vanadium oxide, rhenium oxide, niobium oxide, tantalum oxide, titanium oxide, nickel oxide, copper oxide, cobalt oxide, manganese oxide, chromium oxide, or a combination thereof, the metal sulfide may include, for example, zinc sulfide (ZnS), and the organic material may include, for example, an amine derivative.

Hereinafter, an organic photoelectronic device according to example embodiments is described referring to FIG. 2.

Figure 2:
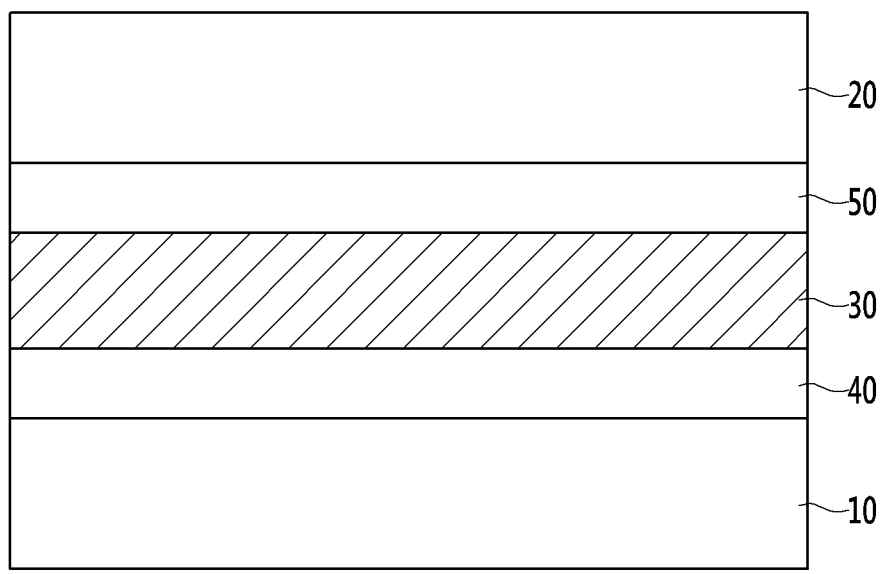
FIG. 2 is a cross-sectional view showing an organic photoelectronic device according to example embodiments.

FIG. 2 is a cross-sectional view showing an organic photoelectronic device according to example embodiments.

Referring to FIG. 2, an organic photoelectronic device 200 according to example embodiments includes a first electrode 10 and a second electrode 20 facing each other, and an active layer 30 interposed between the first electrode 10 and the second electrode 20, like the example embodiment illustrated in FIG. 1.

However, the organic photoelectronic device 200 according to example embodiments further includes charge auxiliary layers 40 and 50 between the first electrode 10 and the active layer 30, and the second electrode 20 and the active layer 30, unlike the example embodiment illustrated in FIG. 1. The charge auxiliary layers 40 and 50 may facilitate the transfer of holes and electrons separated from the active layer 30, so as to increase efficiency.

The charge auxiliary layer 40 may include at least one selected from a hole injection layer (HIL) for facilitating hole injection, a hole transport layer (HTL) for facilitating hole transport, and an electron blocking layer (EBL) for preventing or inhibiting electron transport, and the charge auxiliary layer 50 may include at least one selected from an electron injection layer (EIL) for facilitating electron injection, an electron transport layer (ETL) for facilitating electron transport, and a hole blocking layer (HBL) for preventing or inhibiting hole transport.

The hole transport layer (HTL) may include one selected from, for example, poly(3,4-ethylenedioxythiophene):poly(styrenesulfonate), (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted.

The organic photoelectronic device may be applied to a solar cell, an image sensor, a photo-detector, a photo-sensor and an organic light emitting diode (OLED), but is not limited thereto.

Hereinafter, an example of an image sensor including the photoelectronic device is described referring to drawings. As an example of an image sensor, an organic CMOS image sensor is described.

Figure 3:
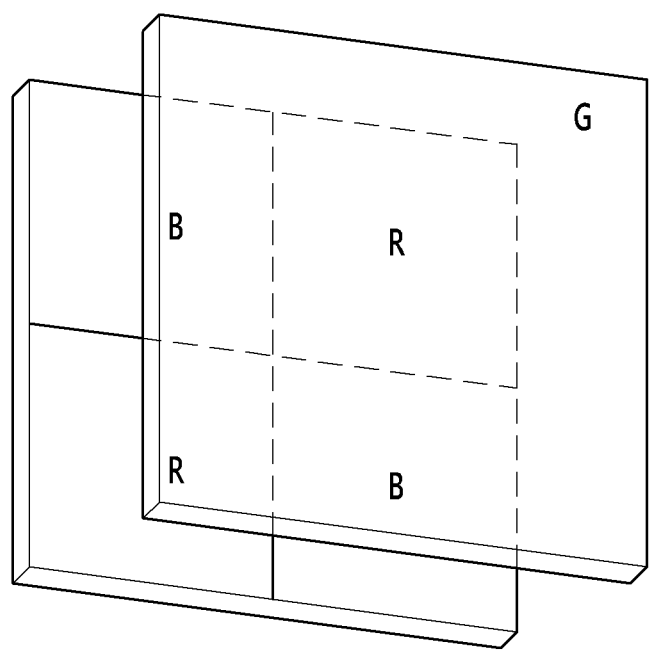
FIG. 3 is a schematic top plan view showing an organic CMOS image sensor according to example embodiments.
Figure 4:
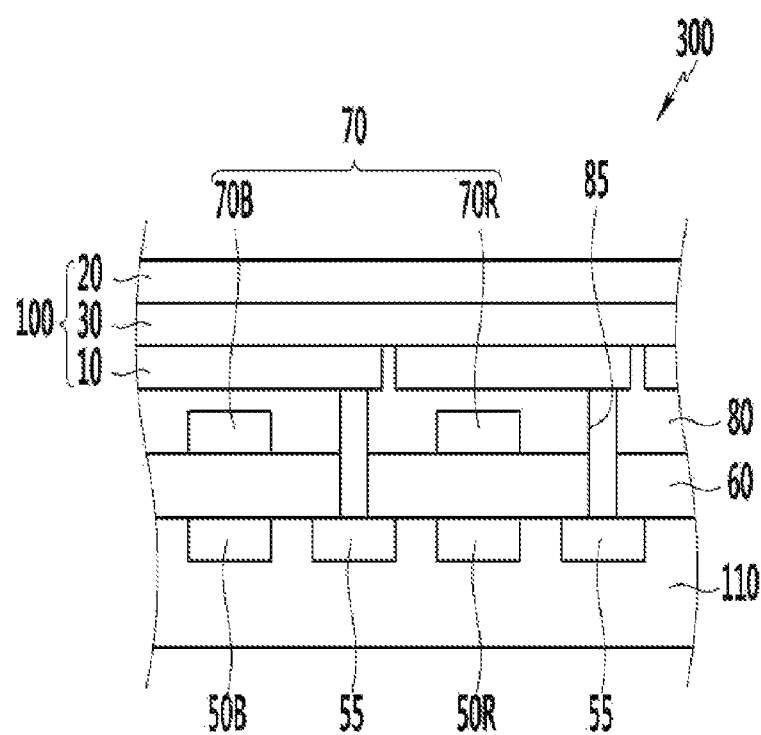
FIG. 4 is a cross-sectional view showing the organic CMOS image sensor of FIG. 3.

FIG. 3 is a schematic top plan view showing an organic CMOS image sensor according to example embodiments, and FIG. 4 is a cross-sectional view showing the organic CMOS image sensor of FIG. 3.

Referring to FIGS. 3 and 4, an organic CMOS image sensor 300 according to example embodiments includes a semiconductor substrate 110 integrated with photo-sensing devices 50B and 50R, a transmission transistor (not shown), a charge storage device 55, a lower insulation layer 60, a color filter layer 70, an upper insulation layer 80, and an organic photoelectronic device 100.

The semiconductor substrate 110 may be a silicon substrate, and is integrated with the photo-sensing devices 50R and 50B, the transmission transistor, and the charge storage device 55. The photo-sensing devices 50R and 50B may be photodiodes.

The photo-sensing devices 50B and 50R, the transmission transistor, and/or the charge storage device 55 may be integrated in each pixel, and as shown in the drawing, the photo-sensing devices 50B and 50R may be included in a blue pixel and a red pixel and the charge storage device 55 may be included in a green pixel.

The photo-sensing devices 50B and 50R sense light, the information sensed by the photo-sensing devices may be transferred by the transmission transistor, the charge storage device 55 is electrically connected with the organic photoelectronic device 100, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material (e.g., a silicon oxide and/or a silicon nitride), or a low dielectric constant (low K) material (e.g., SiC, SiCOH, SiCO, and SiOF). The lower insulation layer 60 has a trench exposing the charge storage device 55. The trench may be filled with fillers.

The color filter layer 70 is formed on the lower insulation layer 60. The color filter layer 70 includes a blue filter 70B formed in the blue pixel and a red filter 70R filled in the red pixel. In example embodiments, a green filter is not included, but a green filter may be further included.

The upper insulation layer 80 is formed on the color filter 70. The upper insulation layer 80 eliminates a step caused by the color filter layer 70 and smoothes the surface. The upper insulation layer 80 and the lower insulation layer 60 may include a contact hole (not shown) exposing a pad, and a through-hole 85 exposing the charge storage device 55 of the green pixel.

The organic photoelectronic device 100 is formed on the upper insulation layer 80. The organic photoelectronic device 100 includes the first electrode 10, the active layer 30, and the second electrode 20 as described above.

The first electrode 10 and the second electrode 20 may be transparent electrodes. In the active layer 30, a p-type semiconductor including the compound represented by the Chemical Formula 1 forms a heterojunction with an n-type semiconductor as described above.

The active layer including the visible light absorption body absorbs light in a green wavelength region and replaces a color filter of a green pixel.

When light enters from the second electrode 20, the light in a green wavelength region may be mainly absorbed in the active layer 30 and photoelectronically converted, while the light in the rest of the wavelength region passes through first electrode 10 and may be sensed in the photo-sensing device 50.

As described above, the organic photoelectronic devices selectively absorbing light in a green wavelength region are stacked and thereby a size of an image sensor may be decreased and a down-sized image sensor may be realized, and simultaneously sensitivity may be increased while reducing crosstalk.

Figure 5:
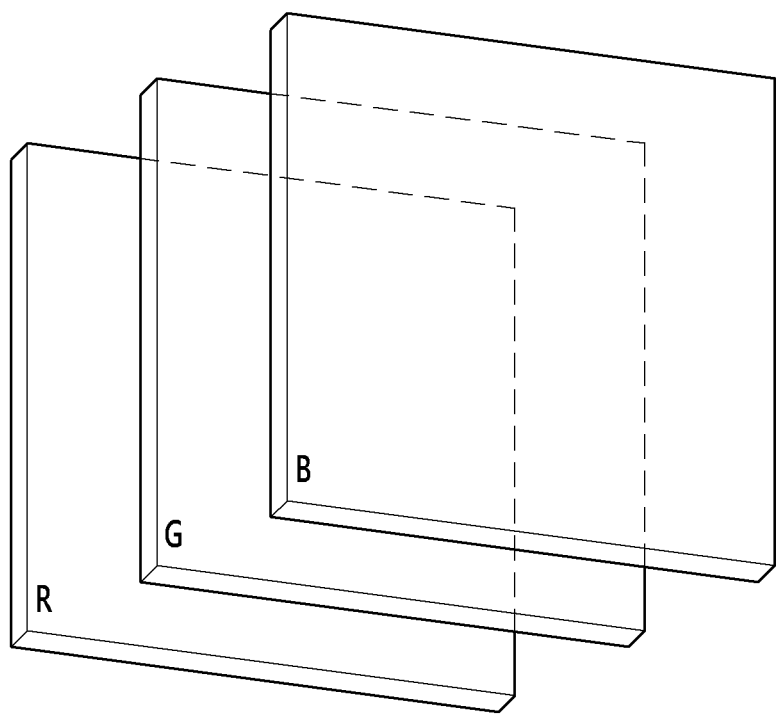
FIG. 5 is a schematic top plan view showing an organic CMOS image sensor according to example embodiments.

FIG. 5 is a schematic top plan view showing an organic CMOS image sensor according to example embodiments.

The organic CMOS image sensor according to example embodiments includes a green photoelectronic device selectively absorbing light in a green wavelength region, a blue photoelectronic device selectively absorbing light in a blue wavelength region, and a red photoelectronic device selectively absorbing light in a green wavelength region and that are stacked.

In the drawing, the red photoelectronic device, the green photoelectronic device, and the blue photoelectronic device are sequentially stacked, but the stack order may be changed without limitation.

The green photoelectronic device may be the organic photoelectronic device 100, the blue photoelectronic device may include electrodes facing each other and an active layer interposed therebetween and including an organic material selectively absorbing light in a blue wavelength region, and the red photoelectronic device may include electrodes facing each other and an active layer interposed therebetween and including an organic material selectively absorbing light in a red wavelength region.

As described above, the organic photoelectronic device selectively absorbing light in a red wavelength region, the organic photoelectronic device selectively absorbing light in a green wavelength region, and the organic photoelectronic device selectively absorbing light in a blue wavelength region are stacked, and thereby a size of an image sensor may be decreased and a down-sized image sensor may be realized.

Hereinafter, the present disclosure is illustrated in more detail with reference to examples. However, these are examples, and the present disclosure is not limited thereto.

p-Type Semiconductor Compound

[Chemical Formula 1aa]

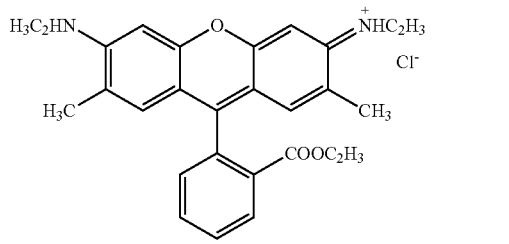

[Chemical Formula 1bb]

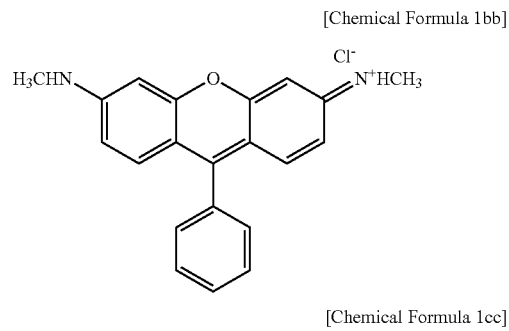

[Chemical Formula 1cc]

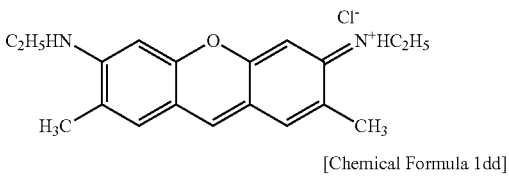

[Chemical Formula 1dd]

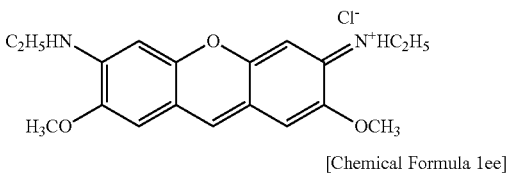

[Chemical Formula 1ee]

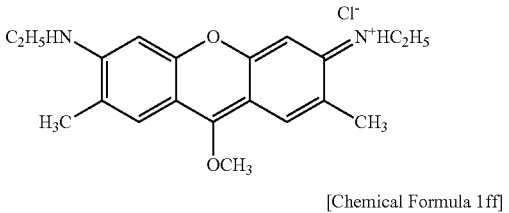

[Chemical Formula 1ff]

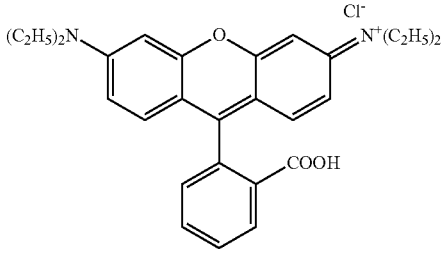

[Chemical Formula 1gg]

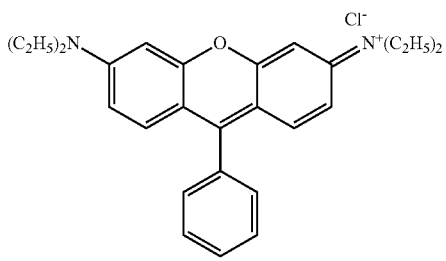

[Chemical Formula 1hh]

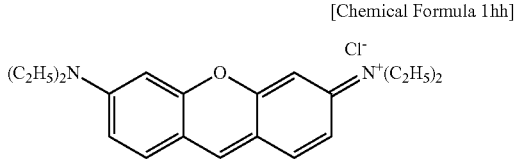

The light absorption characteristics of a compound represented by the Chemical Formula 1aa are evaluated.

The light absorption characteristics of the compound in a solution are evaluated by dissolving the compound represented by the Chemical Formula 1aa in methanol with a concentration of about $1.0 \times 10^{-5}$ mol/L. The light absorption characteristics of the compound in a thin film are evaluated by thermally evaporating the compound under relatively high vacuum of ($<10^{-7}$ Torr) at a speed of about 0.5-1.0 Å/s to form a 70 nm thick-thin film and radiating an ultraviolet (UV)-visible ray (UV-Vis) into the thin film with a Cary 5000 UV spectroscope (Varian Inc.).

As a result, the compound represented by the Chemical Formula 1aa shows a maximum absorption wavelength at about 524 to 530 nm in the solution state and about 560 nm in the thin film state.

Then, light absorption characteristics of the n-type semiconductor compounds represented by the Chemical Formulae 1aa to 1ee depending on a wavelength are evaluated through simulation (Gaussian 09 (B3LYP in the DFT mode, 6-31 G** basis set).

Figure 6:
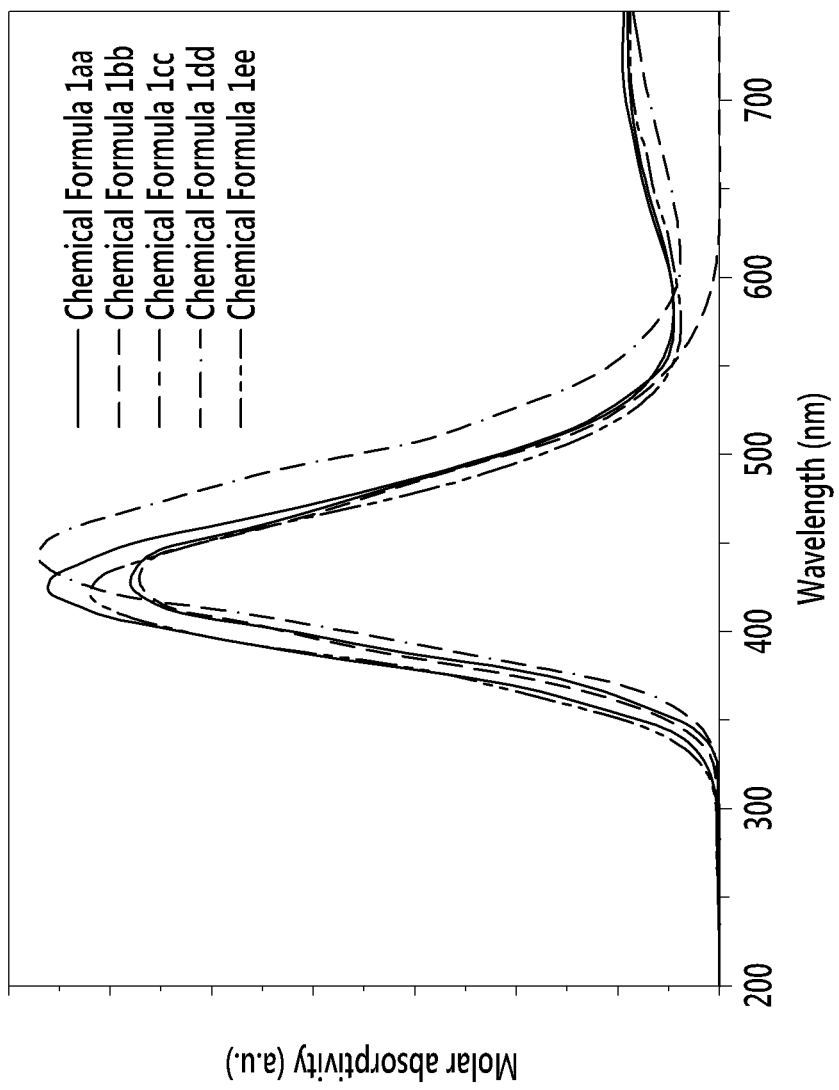
FIG. 6 is a graph showing light absorption characteristics of the compounds represented by Chemical Formulae 1aa to 1ee.

FIG. 6 is a graph showing the light absorption characteristics of the compounds represented by the Chemical Formulae 1aa to 1ee. Referring to FIG. 6, the compounds represented by the Chemical Formula 1bb to 1ee show similar light absorption characteristics to that of the compound represented by Chemical Formula 1aa. Accordingly, the compounds represented by the Chemical Formulae 1bb to 1ee have a maximum absorption wavelength in a wavelength region ranging from about 500 to 600 nm, like the compound represented by the Chemical Formula 1aa.

The light absorption characteristics of the compound represented by the Chemical Formula 1ff are evaluated in the same method as for the compound represented by the Chemical Formula 1aa.

The compound represented by the Chemical Formula 1ff shows a maximum absorption wavelength at about 552 to about 554 nm in the solution state, but at about 566 nm in the thin film state.

Next, light absorption characteristics of the n-type semiconductor compounds represented by the Chemical Formula 1ff to 1hh depending on a wavelength are evaluated through simulation (Gaussian 09 (B3LYP in the DFT mode, 6-31 G** basis set).

Figure 7:
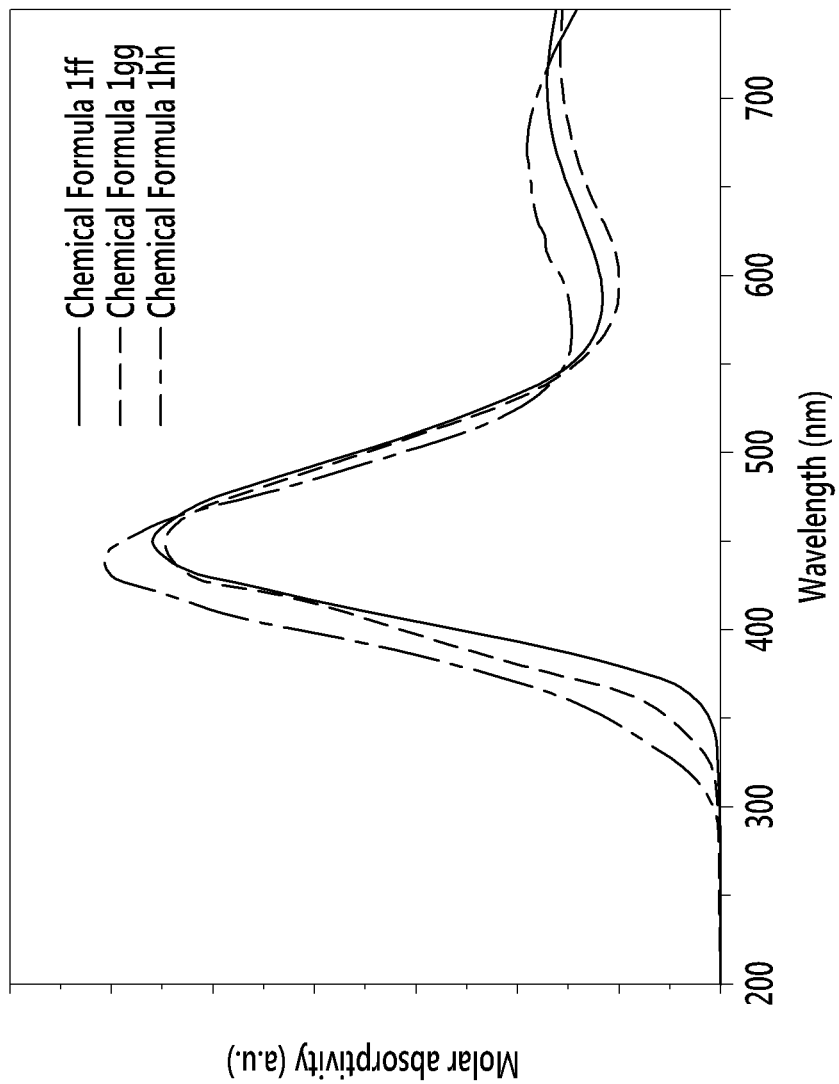
FIG. 7 is a graph showing light absorption characteristics of the compounds represented by Chemical Formulae 1ff to 1hh.

FIG. 7 is a graph showing the light absorption characteristics of the compounds represented by the Chemical Formulae 1ff to 1hh. Referring to FIG. 7, the compounds represented by the Chemical Formula 1gg to 1hh show similar light absorption characteristics to that of the compound represented by the Chemical Formula 1ff. Accordingly, the compounds represented by the Chemical Formula 1gg to 1hh are expected to have a maximum absorption wavelength in a wavelength region ranging from about 500 to 600 nm like the compound represented by the Chemical Formula 1ff.

Manufacture of Organic Photoelectronic Device

Example 1

An about 150 nm-thick first electrode is formed on a glass substrate by sputtering ITO, and a 30 nm-thick molybdenum oxide ($MoO_x$) thin film as a charge auxiliary layer is formed thereon. Subsequently, a compound (Sigma-Aldrich Co., Ltd.) represented by the Chemical Formula 1aa as a p-type semiconductor and a compound (Lumtec Corp.) represented by the following Chemical Formula 2aa as an n-type semiconductor are co-deposited in a ratio of 1:1 to form a 70 nm thick active layer on the molybdenum oxide ($MoO_x$) thin film. Then, an 80 nm-thick second electrode is formed on the active layer by sputtering aluminum (Al), manufacturing an organic photoelectronic device.

[Chemical Formula 2aa]

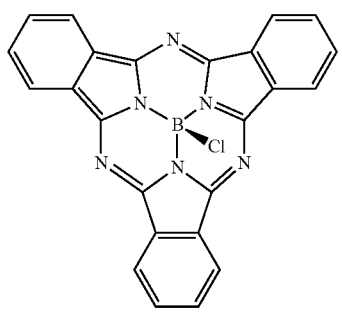

Example 2

An organic photoelectronic device is manufactured according to the same method as Example 1, except for codepositing the compound represented by the Chemical Formula 1aa as a p-type semiconductor and the compound represented by the following Chemical Formula 2aa as an n-type semiconductor in a ratio of 2:1.

Example 3

An organic photoelectronic device is manufactured according to the same method as Example 1, except for codepositing the compound represented by the Chemical Formula 1aa as a p-type semiconductor and the compound represented by the following Chemical Formula 2aa as an n-type semiconductor in a ratio of 1:2.

Comparative Example 1

An organic photoelectronic device is manufactured according to the same method as Example 1, except for codepositing the compound represented by the following Chemical Formula 2aa instead of the compound represented by the Chemical Formula 1aa as a p-type semiconductor and a compound represented by the following Chemical Formula 3 instead of the compound represented by the following Chemical Formula 2aa as an n-type semiconductor.

[Chemical Formula 3]

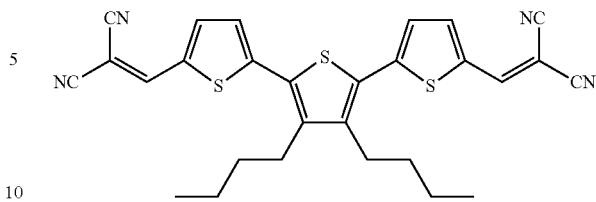

Comparative Example 2

An organic photoelectronic device is manufactured according to the same method as Example 1, except for codepositing the compound represented by the following Chemical Formula 4 instead of the compound represented by the Chemical Formula 1aa as a p-type semiconductor.

[Chemical Formula 4]

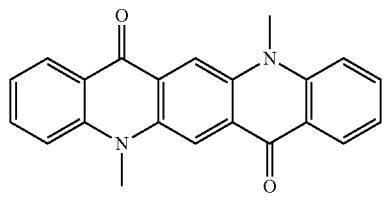

Evaluation 1

External quantum efficiency (EQE) and full width at half maximum (FWHM) of the organic photoelectronic devices according to Example 1 and Comparative Examples 1 and 2 are evaluated.

The external quantum efficiency (EQE) is measured by using an IPCE measurement system (McScience Co., Ltd., Korea). First of all, the external quantum efficiency (EQE) is calibrated by using a Si photodiode (Hamamatsu Photonics K.K., Japan) mounted in the organic photoelectronic devices according to Example 1 and Comparative Examples 1 and 2, and their external quantum efficiency is measured at a wavelength ranging from about 350 to 800 nm.

The full width at half maximum (FWHM) is obtained by measuring width of a wavelength corresponding to a half of a maximum absorption point in the external quantum efficiency graph.

Figure 8:
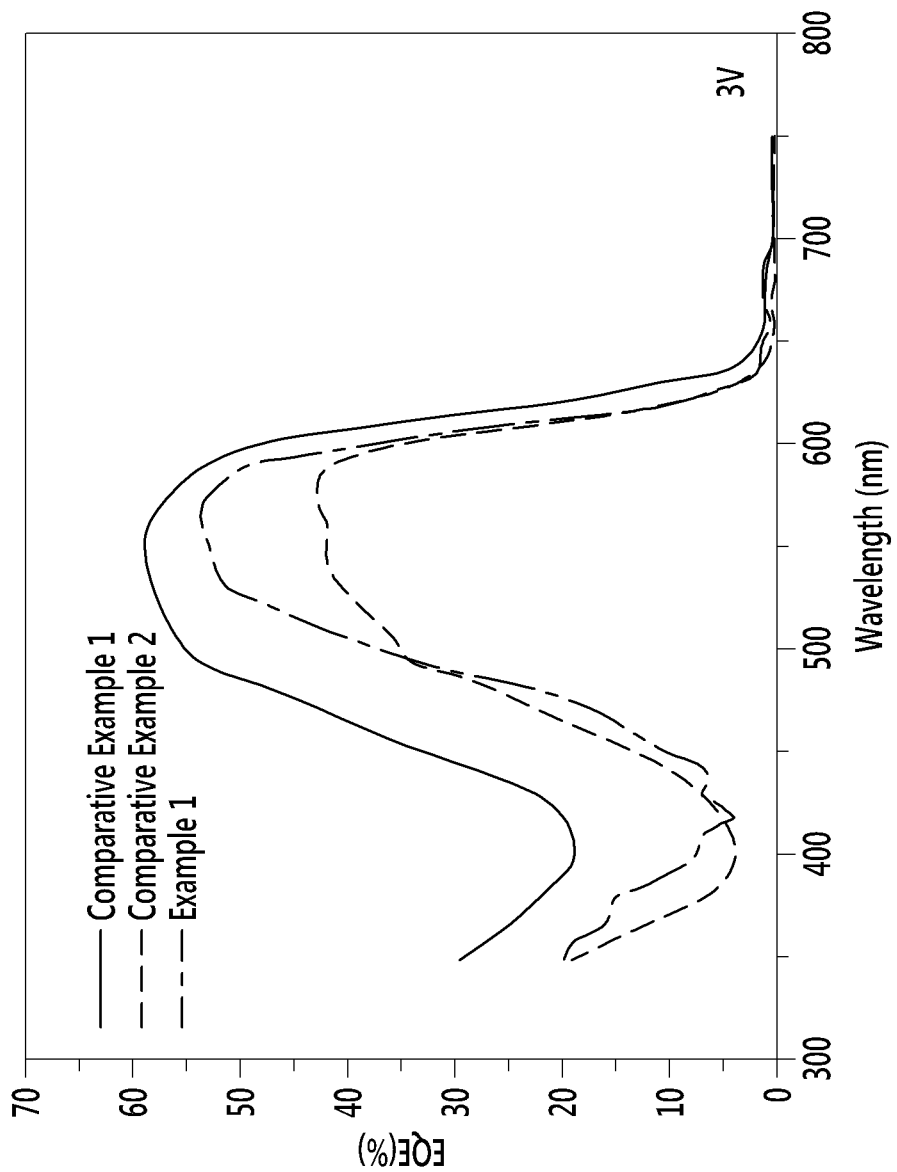
FIG. 8 is a graph showing external quantum efficiency (EQE) depending on a wavelength at 3 V of the organic photoelectronic devices according to Example 1 and Comparative Examples 1 and 2.

The results are provided in FIG. 8 and Table 1.

FIG. 8 is a graph showing external quantum efficiency (EQE) of the organic photoelectronic devices according to Example 1 and Comparative Examples 1 and 2 at 3 V depending on a wavelength.

Referring to FIG. 8, the organic photoelectronic devices according to Example 1 and Comparative Examples 1 and 2 show a maximum peak of external quantum efficiency (EQE) in a green wavelength region of about 500 nm to 600 nm.

TABLE 1

| | FWHM (nm) |
|---|---|
| Example 1 | 120 nm |
| Comparative Example 1 | 160 nm |

TABLE 1-continued

| | FWHM (nm) |
|---|---|
| Comparative Example 2 | 140 nm |

Referring to FIG. 8 and Table 1, the organic photoelectronic device of Example 1 shows external quantum efficiency (EQE) having a narrower full width at half maximum (FWHM) in the wavelength region of about 500 nm to 600 nm than those of the organic photoelectronic devices according to Comparative Examples 1 and 2. Accordingly, the organic photoelectronic device of Example 1 shows higher wavelength selectivity regarding a green wavelength region than that of the organic photoelectronic devices according to Comparative Examples 1 and 2.

Evaluation 2

The external quantum efficiency (EQE) of the organic photoelectronic devices according to Examples 2 and 3 is calculated according to the same method as Evaluation 1. Subsequently, the external quantum efficiency (EQE) of the organic photoelectronic devices of Examples 1 to 3 obtained according to the Evaluation 1 is normalized.

Figure 9:
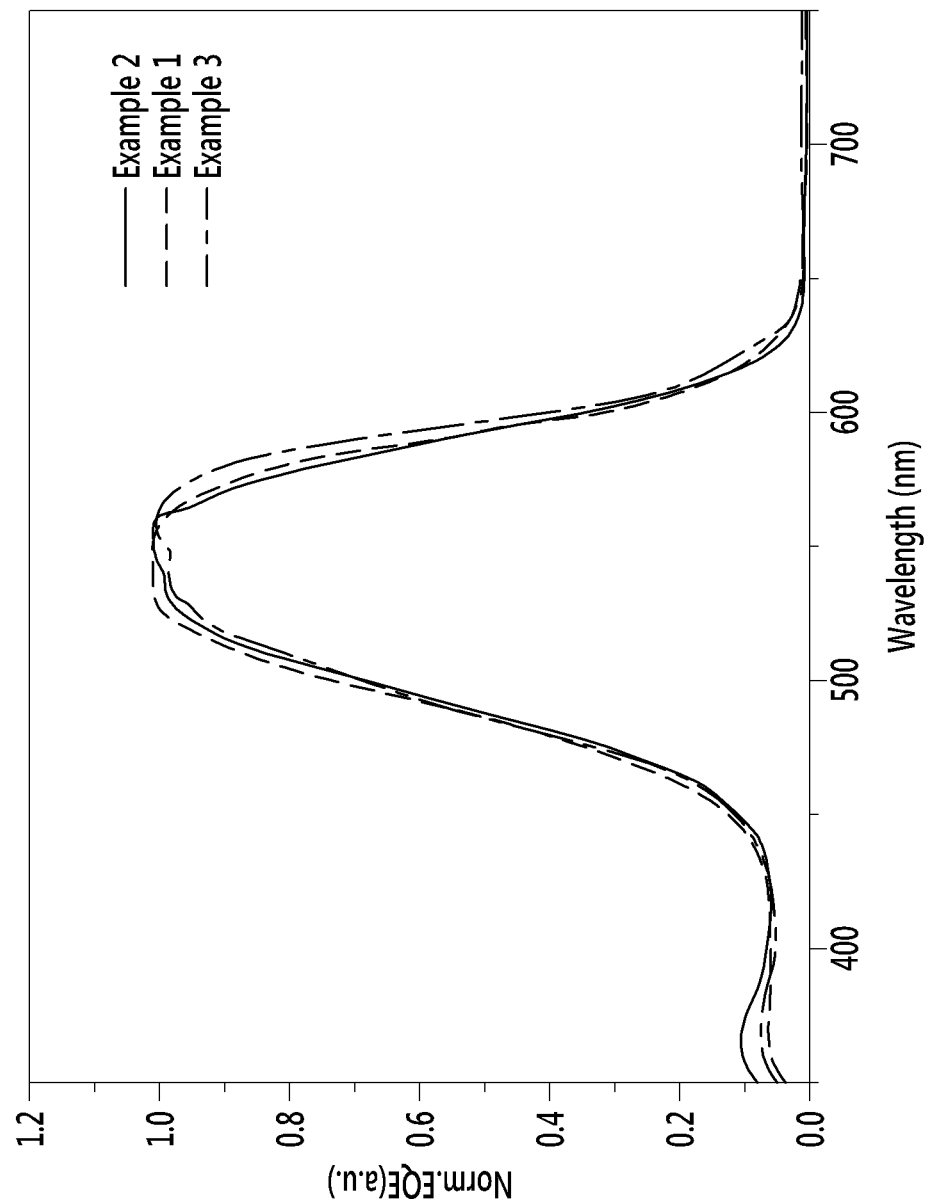
FIG. 9 is a graph showing normalized external quantum efficiency (EQE) depending on a wavelength of the organic photoelectronic devices according to Examples 1 to 3.

The results are provided in FIG. 9.

FIG. 9 is a graph showing the normalized external quantum efficiency (EQE) of the organic photoelectronic devices according to Examples 1 to 3 depending on a wavelength.

Referring to FIG. 9, the organic photoelectronic devices according to Examples 2 and 3 show a maximum peak of external quantum efficiency (EQE) in a green wavelength region of about 500 nm to 600 nm, like the organic photoelectronic device according to Example 1.

Evaluation 3

The crosstalk of an image sensor respectively applying the organic photoelectronic devices according to Example 1 and Comparative Examples 1 and 2 and having a structure shown in FIG. 4 is evaluated.

The crosstalk evaluation is simulated by using a LUMERRICAL (3D) program. Herein, how much the organic photoelectronic devices are optically interfered with is evaluated by dividing a wavelength region into three regions of 440-480 nm (blue), 520-560 nm (green), and 590-630 nm (red). In other words, a relative integral value of sensitivity curves of red and green devices in the 440-480 nm region is obtained by regarding an integral value of the sensitivity curve of a blue device in the 440-480 nm region as 100. The relative integral value is crosstalk of the red and green devices regarding a blue region in the 440-480 nm region. Likewise, a relative integral value of sensitivity curves of red and blue devices in the 520-560 nm region is obtained by regarding an integral value of the sensitivity curve of a green device in the 520-560 nm region as 100. The relative integral value is crosstalk of the red and blue devices about a green region in the 520-560 nm region. Likewise, a relative integral value of sensitivity curves of green and blue devices in the 590-630 nm region is obtained by regarding an integral value of the sensitivity curve of a red device in the 590-630 nm region as 100. The relative integral value is a crosstalk of the green and blue devices about a red region in the 590-630 nm region. Lastly, the crosstalk values are averaged to obtain average crosstalk.

Figure 10:
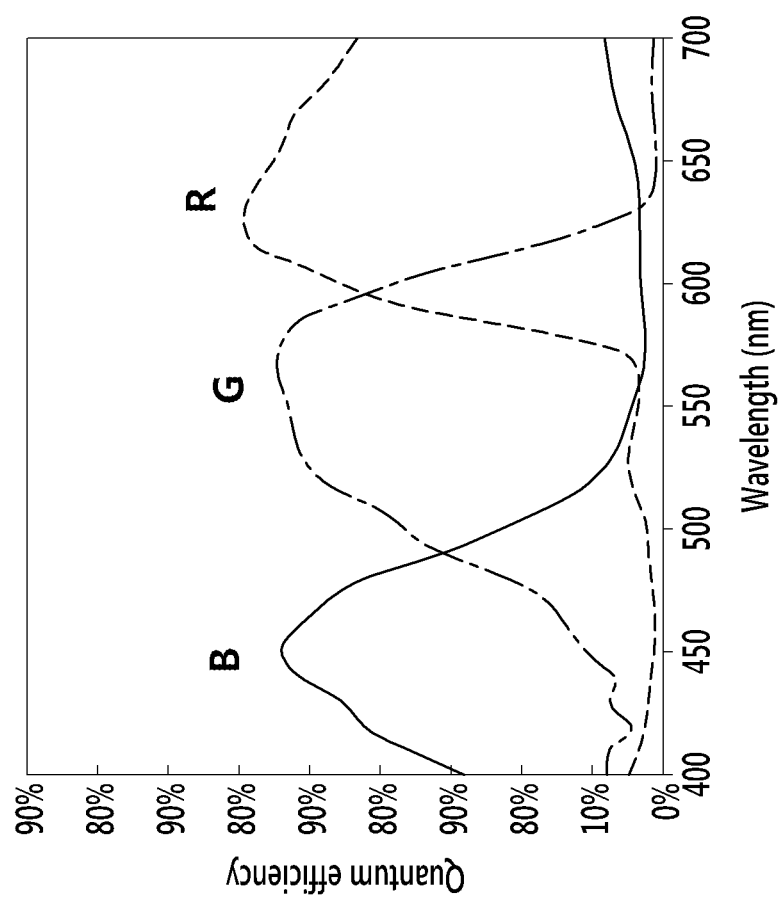
FIG. 10 is a graph showing quantum efficiency (QE) of a red device region, a green device region, and a blue device region of the image sensor including the organic photoelectronic device according to Example 1.

The results are provided in FIG. 10 and Table 2.

Figure 11:
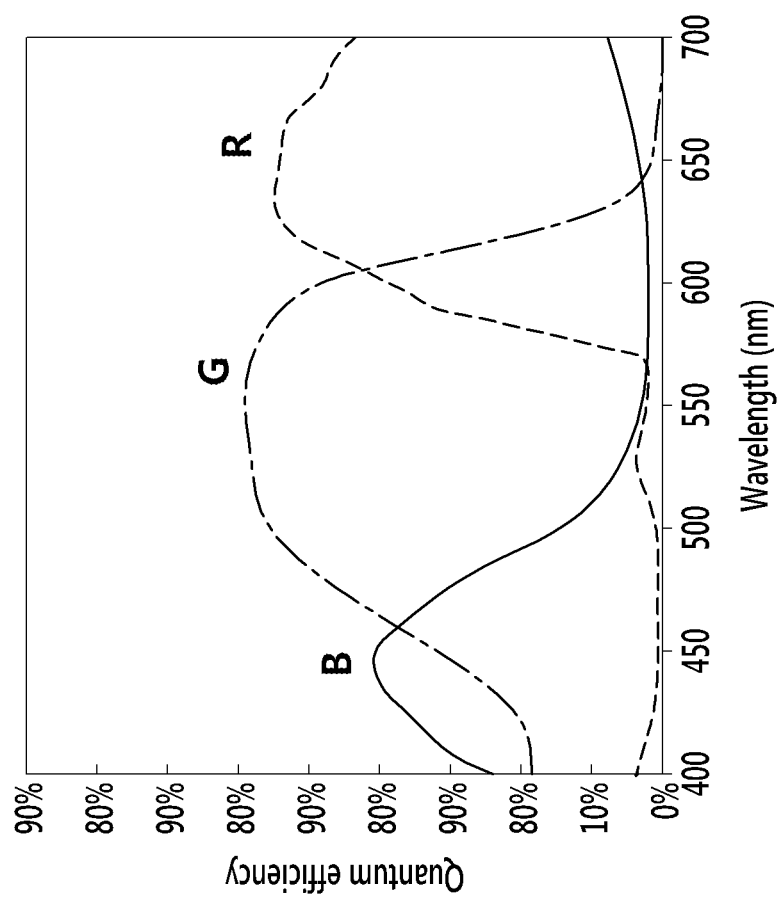
FIGS. 11 and 12 are graphs showing quantum efficiency (QE) of a red device region, a green device region, and a blue device region of the image sensor including the organic photoelectronic devices according to Comparative Examples 1 and 2, respectively.
Figure 12:
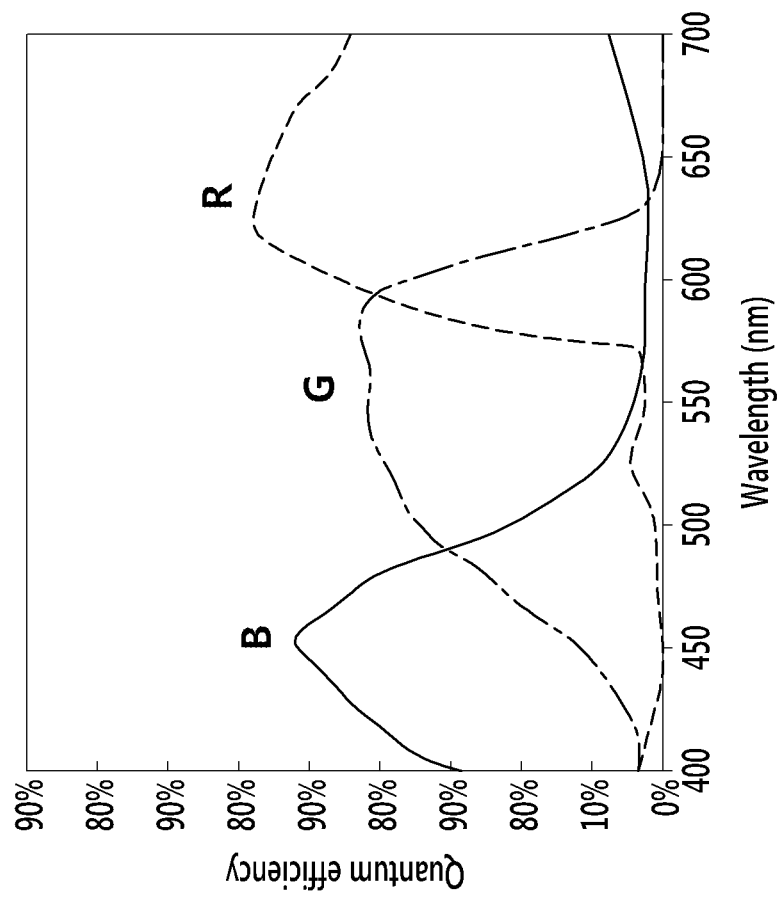

FIG. 10 shows quantum efficiency (QE) in the red, green, and blue device regions of the image sensor manufactured by applying the organic photoelectronic device of Example 1, and FIGS. 11 and 12 show quantum efficiency (QE) in the red, green, and blue device regions of each image sensor manufactured by respectively applying the organic photoelectronic devices of Comparative Examples 1 and 2.

TABLE 2

| | Average crosstalk (%) |
|---|---|
| Example 1 | 17.2 |
| Comparative Example 1 | 33 |
| Comparative Example 2 | 19.6 |

Referring to FIGS. 10 to 12 and Table 2, the image sensor manufactured by applying the organic photoelectronic device of Example 1 shows decreased crosstalk compared with the image sensors manufactured by respectively applying the organic photoelectronic devices of Comparative Examples 1 and 2.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device, comprising:

a first electrode and a second electrode facing each other; and an active layer between the first electrode and the second electrode, the active layer including a heterojunction of a p-type semiconductor and an n-type semiconductor, the p-type semiconductor including a compound represented by the following Chemical Formula 1, and the n-type semiconductor including a compound represented by the following Chemical Formula 2:

[Chemical Formula 1]

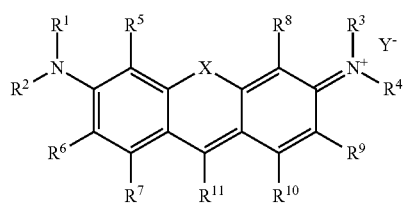

wherein, in the Chemical Formula 1,

X is one of oxygen (—O—) and sulfur (—S—), each of $R^1$ to $R^{11}$ are independently one of hydrogen, a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_3$ to $C_{30}$ heteroaryl group, and a combination thereof, and $Y^-$ is a halogen ion;

[Chemical Formula 2]

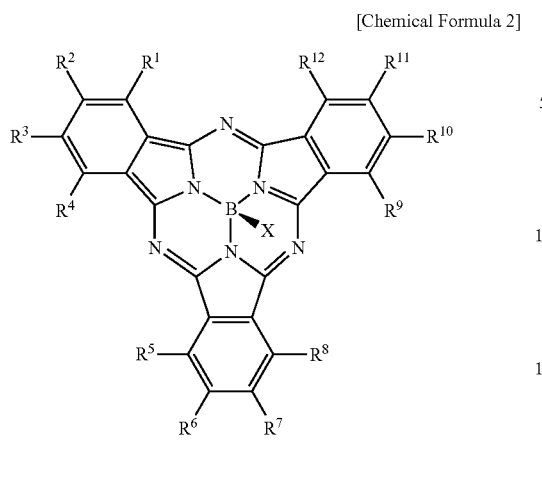

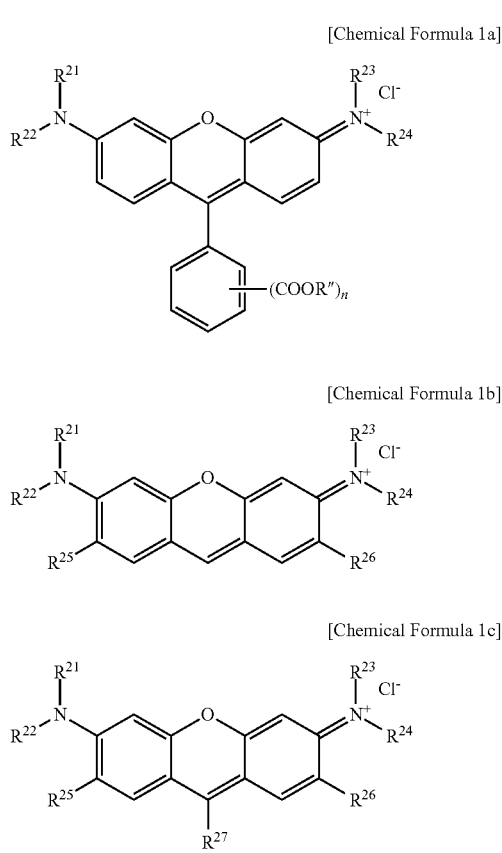

wherein, in the Chemical Formula 2,
each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

2. The organic photoelectronic device of claim 1, wherein each of the $R^1$ to $R^4$ are independently one of hydrogen, a substituted or unsubstituted $C_1$ to $C_{30}$ alkyl group, and a combination thereof.

3. The organic photoelectronic device of claim 1, wherein the $R^{11}$ is a group derived from one of a substituted or unsubstituted benzene, naphthalene, anthracene, biphenyl, and a combination thereof.

4. The organic photoelectronic device of claim 3, wherein
the $R^{11}$ is a —COOR' group substituting at least one hydrogen, and
the R' is one of hydrogen, a substituted or unsubstituted $C_1$ to $C_{30}$ alkyl group, and a combination thereof.

5. The organic photoelectronic device of claim 1, wherein at least one of the $R^5$ to $R^{11}$ is one of a substituted or unsubstituted $C_1$ to $C_{30}$ alkoxy group and a substituted or unsubstituted $C_1$ to $C_{30}$ alkyl group.

6. The organic photoelectronic device of claim 1, wherein the X is oxygen (—O—) and the $Y^-$ is a chloride ion (—$Cl^-$).

7. The organic photoelectronic device of claim 1, wherein the compound represented by the Chemical Formula 1 has a maximum absorption wavelength of 500 to 600 nm in a visible ray region.

8. The organic photoelectronic device of claim 1, wherein the p-type semiconductor includes a compound represented by the following Chemical Formula 1a, Chemical Formula 1b, or Chemical Formula 1c:

wherein, in the Chemical Formulae 1a to 1c,
each of $R^{21}$ to $R^{24}$ are independently one of hydrogen, a substituted or unsubstituted $C_1$ to $C_{30}$ alkyl group, and a combination thereof,
each of $R^{25}$ to $R^{27}$ are independently one of a unsubstituted $C_1$ to $C_{30}$ alkyl group, a substituted or unsubstituted $C_1$ to $C_{30}$ alkoxy group, and a combination thereof,
R" is one of hydrogen, a substituted or unsubstituted $C_1$ to $C_{30}$ alkyl group, and a combination thereof, and
n is 0 or 1.

9. The organic photoelectronic device of claim 1, wherein the compound represented by the Chemical Formula 2 is one of compounds represented by the following Chemical Formulae 2a to 2e:

[Chemical Formula 2a]

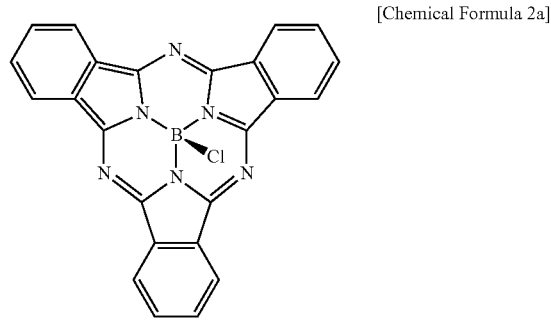

[Chemical Formula 2b]

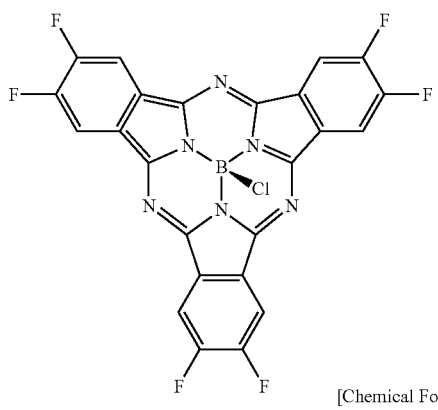

[Chemical Formula 2c]

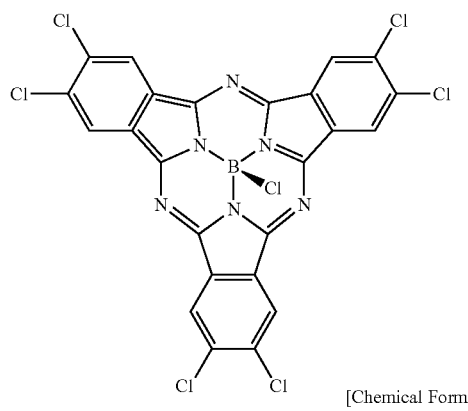

[Chemical Formula 2d]

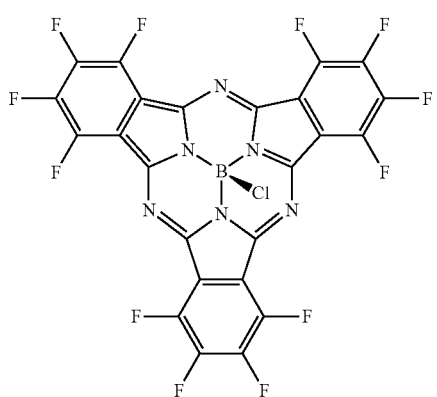

[Chemical Formula 2e]

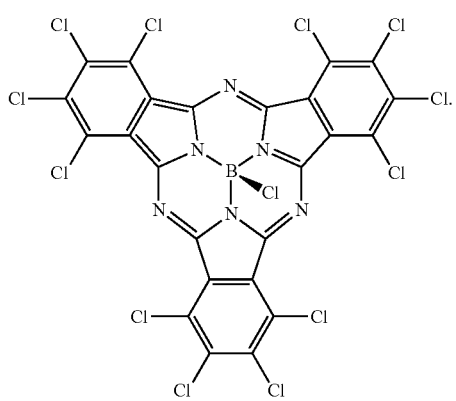

10. The organic photoelectronic device of claim 1, wherein the organic photoelectronic device shows a light absorption curve having a full width at half maximum (FWHM) of about 50 nm to about 150 nm.

11. The organic photoelectronic device of claim 1, wherein the active layer selectively absorbs light in a green wavelength region.

12. The organic photoelectronic device of claim 1, wherein the active layer includes an intrinsic layer including the p-type semiconductor and the n-type semiconductor in a ratio of about 1:100 to about 100:1.

13. The organic photoelectronic device of claim 1, wherein the active layer includes an intrinsic layer including the p-type semiconductor and the n-type semiconductor in a ratio of about 1:10 to about 10:1.

14. The organic photoelectronic device of claim 12, wherein the active layer further comprises a p-type layer including the p-type semiconductor.

15. The organic photoelectronic device of claim 12, wherein the active layer further comprises a n-type layer including the n-type semiconductor.

16. The organic photoelectronic device of claim 1, further comprising:
a charge auxiliary layer between at least one of the first electrode and the active layer, and the second electrode and the active layer.

17. An image sensor comprising the organic photoelectronic device of claim 1.

18. The image sensor of claim 17, further comprising:
a semiconductor substrate integrated with a plurality of first photo-sensing devices sensing light in a blue wavelength region and a plurality of second photo-sensing devices sensing light in a red wavelength region;
a color filter layer on the semiconductor substrate, the color filter layer including a blue filter selectively absorbing light in a blue wavelength region and a red filter selectively absorbing light in a red wavelength region,
wherein the organic photoelectronic device is on the color filter layer and selectively absorbs light in a green wavelength region.

19. The image sensor of claim 17, wherein the organic photoelectronic device is a green photoelectronic device, further comprising:
a blue photoelectronic device selectively absorbing light in a blue wavelength region; and
a red photoelectronic device selectively absorbing light in a red wavelength region,
wherein the organic photoelectronic device, a blue photoelectronic device and a red photoelectronic device are sequentially stacked.

* * * * *